(12) United States Patent
Shankar

(10) Patent No.: US 10,469,066 B1
(45) Date of Patent: Nov. 5, 2019

(54) TRICKLE CHARGE CONTROL

(71) Applicant: TEXAS INSTRUMENTS INCORPORATED, Dallas, TX (US)

(72) Inventor: Krishnamurthy Ganapathi Shankar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/047,788

(22) Filed: Jul. 27, 2018

(51) Int. Cl.
*H02M 3/07* (2006.01)
*H03K 17/06* (2006.01)
*H02P 7/28* (2016.01)
*H03K 17/22* (2006.01)

(52) U.S. Cl.
CPC ............ *H03K 17/063* (2013.01); *H02M 3/07* (2013.01); *H02P 7/28* (2013.01); *H03K 17/223* (2013.01); *H03K 2217/0063* (2013.01); *H03K 2217/0081* (2013.01)

(58) Field of Classification Search
CPC ............... H03K 17/063; H03K 17/223; H03K 2217/0063; H03K 2217/0081; H02M 3/07; H02P 7/28

USPC .......................................................... 327/536
See application file for complete search history.

(56) References Cited

U.S. PATENT DOCUMENTS 5,796,276 A * 8/1998 Phillips ................ H03K 17/063
 323/315
9,762,132 B2 * 9/2017 Freeman ........... H02M 3/33546

* cited by examiner

*Primary Examiner* — Dinh T Le
(74) *Attorney, Agent, or Firm* — John R. Pessetto; Charles A. Brill; Frank D. Cimino

(57) ABSTRACT

A system includes a trickle charge control circuit coupled to a charge pump and a motor driver circuit. The trickle charge control circuit is configured to sense a voltage at a bootstrap capacitor voltage node (VBST) of the motor driver circuit; as a result of the voltage at VBST being greater than a voltage at an input voltage node (VIN), couple a charge pump voltage node (VCP) to VBST of the motor driver circuit, where a voltage at VCP is greater than the voltage at VIN; and as a result of the voltage at VBST being less than the voltage at VIN, decouple VCP from the charge pump from VBST of the motor driver circuit.

5 Claims, 5 Drawing Sheets

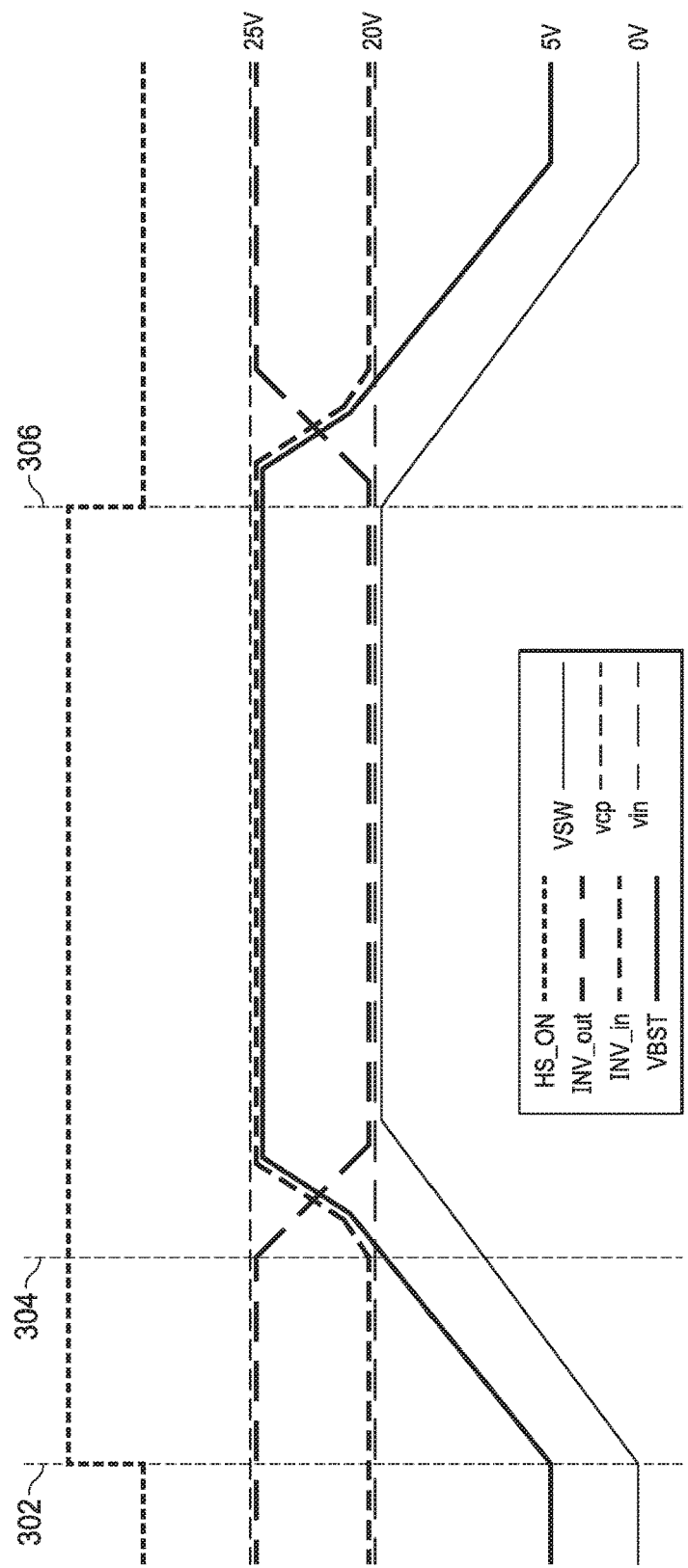

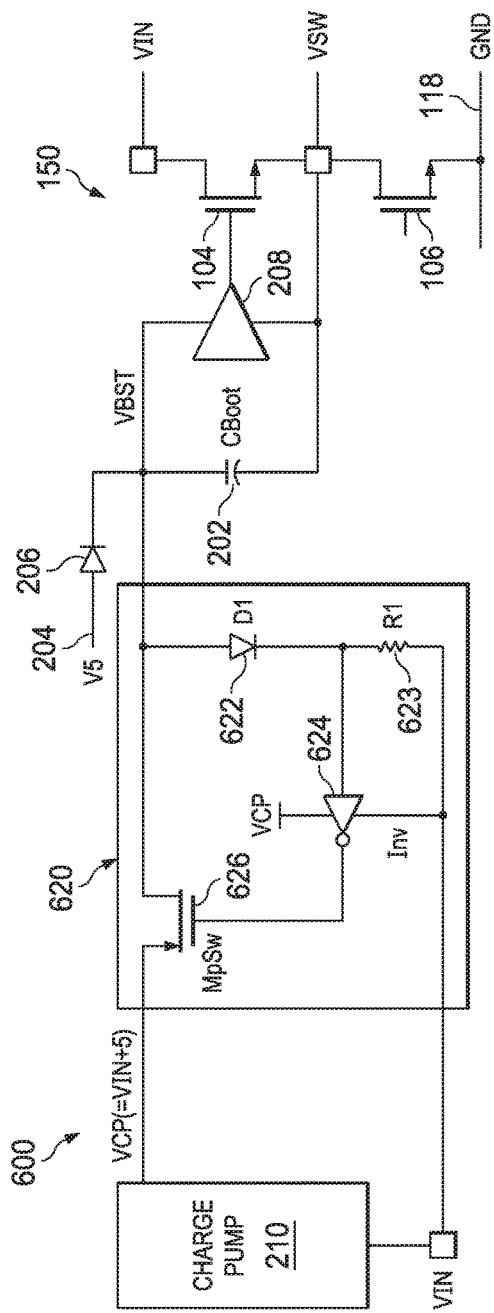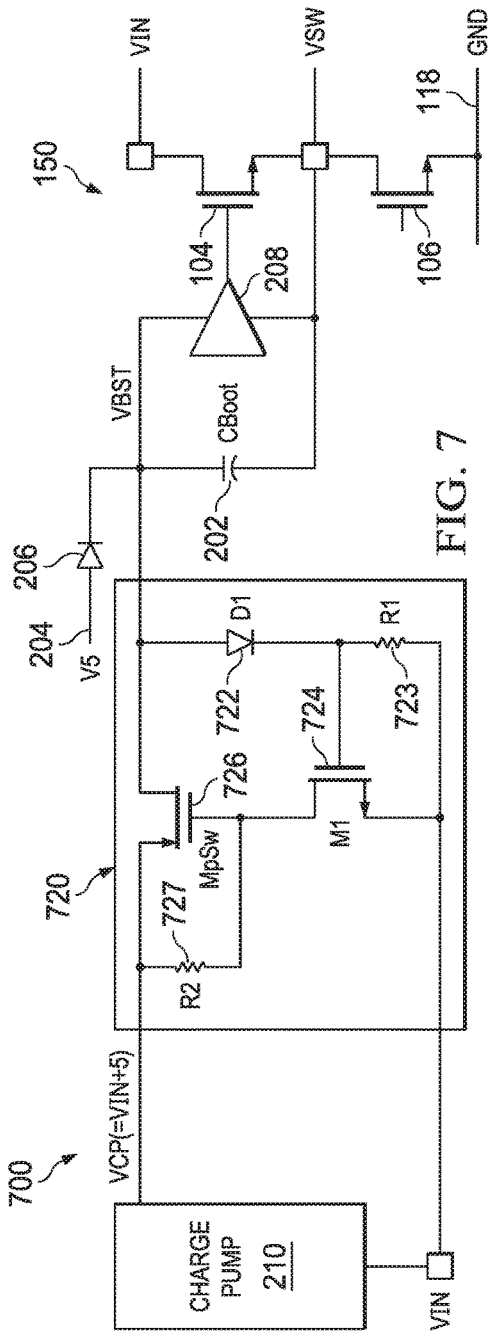
FIG. 6
FIG. 7

TRICKLE CHARGE CONTROL

BACKGROUND

None.

SUMMARY

In accordance with at least one example of the disclosure, a system comprises a trickle charge control circuit coupled to a charge pump and a motor driver circuit. The trickle charge control circuit is configured to sense a voltage at a bootstrap capacitor voltage node (VBST) of the motor driver circuit; as a result of the voltage at VBST being greater than a voltage at an input voltage node (VIN), couple a charge pump voltage node (VCP) to VBST of the motor driver circuit, where a voltage at VCP is greater than the voltage at VIN; and as a result of the voltage at VBST being less than the voltage at VIN, decouple VCP from the charge pump from VBST of the motor driver circuit.

In accordance with another example of the disclosure, a system comprises a motor driver circuit coupled to an input voltage node (VIN) coupled to a voltage source. The motor driver circuit comprises a switched voltage phase node (VSW); a high-side metal-oxide-semiconductor field-effect transistor (MOSFET) coupled between VIN and VSW; a low-side MOSFET coupled between VSW and ground; a bootstrap capacitor coupled between a bootstrap capacitor voltage node (VBST) and VSW, where VBST is coupled to a voltage source by way of a diode; and a gate driver to apply either a voltage at VBST or a voltage at VSW to a gate of the high-side MOSFET. The system also comprises a charge pump coupled to VIN and configured to generate a voltage at a charge pump voltage node (VCP), where a voltage at VCP is greater than a voltage at VIN. The system further comprises a trickle charge control circuit coupled to the charge pump and the motor driver circuit. The trickle charge control circuit is configured to sense the voltage at VBST; as a result of the voltage at VBST being greater than the voltage at VIN, couple VCP from the charge pump to VBST of the motor driver circuit; and as a result of the voltage at VBST being less than the voltage at VIN, decouple VCP from the charge pump from VBST of the motor driver circuit.

In accordance with yet another example of the disclosure, a system comprises only one charge pump coupled to an input voltage node (VIN) coupled to a voltage source and configured to generate a voltage at a charge pump voltage node (VCP), where a voltage at VCP is greater than a voltage at VIN. The system also comprises a plurality of motor driver circuits coupled to VIN. Each motor driver circuit comprises a switched voltage phase node (VSW); a high-side metal-oxide-semiconductor field-effect transistor (MOSFET) coupled between VIN and VSW; a low-side MOSFET coupled between VSW and ground; a bootstrap capacitor coupled between a bootstrap capacitor voltage node (VBST) and VSW, where VBST is coupled to a voltage source by way of a diode; and a gate driver to apply either a voltage at VBST or a voltage at VSW to a gate of the high-side MOSFET. The system further comprises, for each of the motor driver circuits, an associated trickle charge control circuit coupled to the charge pump and its associated motor driver circuit. The trickle charge control circuits are configured to sense the voltage at VBST of the associated motor driver circuit; as a result of the voltage at VBST being greater than the voltage at VIN, couple VCP from the charge pump to VBST of the associated motor driver circuit; and as a result of the voltage at VBST being less than the voltage at VIN, decouple VCP from the charge pump from VBST of the associated motor driver circuit.

BRIEF DESCRIPTION OF THE DRAWINGS

For a detailed description of various examples, reference will now be made to the accompanying drawings in which:

FIG. 3 shows a timing diagram associated with systems including a trickle charge control circuit in accordance with various examples;

FIG. 6 shows a circuit schematic diagram of a system including still another trickle charge control circuit in accordance with various examples; and FIG. 7 shows a circuit schematic diagram of a system including another trickle charge control circuit in accordance with various examples.

DETAILED DESCRIPTION

Figure 1A:
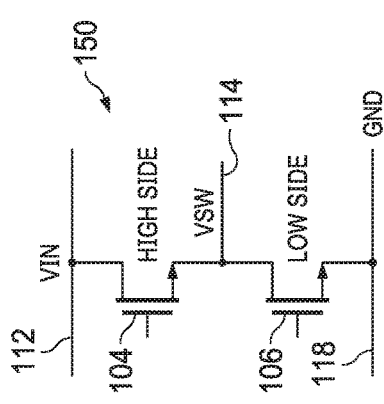
FIG. 1a shows a circuit schematic diagram of an exemplary motor in accordance with various examples.

An electric motor converts electrical energy into mechanical energy. Electric motors may be powered by direct current (DC) sources, such as brushed or brushless DC motors. FIG. 1a shows an exemplary motor 102, which is driven by an integrated circuit including switches 104, 106, 108, 110. The high-side switches 104, 108 couple a voltage 112 to a switched voltage phase nodes 114, 116, respectively, which are generally referred to as "VSW." The voltage 112 is supplied with a DC voltage from a voltage source and comprises a node generally referred to as an input voltage node or "VIN." The low-side switches 106, 110 couple a ground 118 to VSW 114, 116, respectively. The ground 118 comprises a node generally referred to as "ground." During a first phase, one high-side switch 104 and the opposing low-side switch 110 are closed, causing current to pass through the motor 102 in a first direction; the switches 106, 108 are open. During a second phase, the switches 106, 108 close and the switches 104, 110 open, causing current to pass through the motor 102 in a second, opposing direction.

Figure 1B:
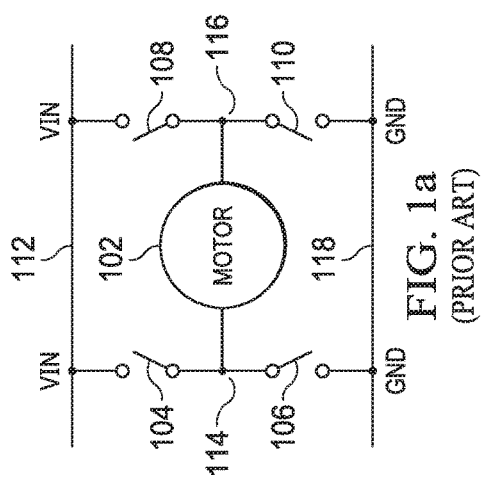
FIG. 1b shows a circuit schematic diagram of an exemplary motor driver circuit in accordance with various examples.

FIG. 1b shows a motor driver circuit 150 of FIG. 1a in greater detail. In particular, the switches 104, 106 comprise n-type metal-oxide-semiconductor field-effect transistors (MOSFETs). The MOSFETs 104, 106 are designed to have a low resistance, which requires a gate of the MOSFET to be driven to a higher voltage than a source of the MOSFET. As explained above, only one of the MOSFETs 104, 106 is on at a given time. The source of the low-side MOSFET 106 is coupled to ground 118, and thus when MOSFET 106 is on, the gate of MOSFET 106 need only be driven to a voltage greater than ground, which is not problematic. However, when the high-side MOSFET 104 is on, a voltage at VSW, which is coupled to the source of MOSFET 104, will reach the voltage at VIN, and thus the gate of MOSFET 104 needs to be driven to a voltage greater than VIN.

Conventional solutions to provide an adequate gate voltage to MOSFET 104 include using a bootstrap capacitor to ensure that the gate voltage is higher than the voltage at VSW. In some cases, a charge pump may be utilized to maintain a charge of the bootstrap capacitor, which is advantageous in low-frequency operation where the bootstrap capacitor may otherwise become discharged, causing the gate voltage of MOSFET 104 to drop. However, a dedicated charge pump is required for each motor driver circuit 150, which in the case of FIGS. 1a and 1b is two separate charge pumps, which requires additional space and power and thus is not efficient. Multi-phase motors 102 require a charge pump per phase to ensure the various bootstrap capacitors do not discharge during low-frequency operation, exacerbating the space requirements.

Examples of the present disclosure include a trickle charge control circuit that is coupled to a motor driver circuit and a charge pump. The motor driver circuit includes a bootstrap capacitor coupled to and between a switched voltage phase node (VSW) and a bootstrap capacitor voltage node (VBST). The trickle charge control circuit is configured to sense a voltage at VBST, which increases when a high-side MOSFET of the motor driver circuit is on as VSW increases to a voltage at an input voltage node (VIN). In one example, the voltage at VIN is on the order of 20V, although it should be appreciated that the scope of the present disclosure is not limited to particular voltage levels.

When the voltage at VBST rises above the voltage at VIN, the trickle charge control circuit couples a charge pump voltage node (VCP) of the charge pump, which is at a voltage greater than the voltage at VIN, to VBST. When VCP is coupled to VBST, the bootstrap capacitor remains charged regardless of a motor operating frequency and a voltage greater than VIN is applied to the high-side MOSFET, ensuring an appropriately low resistance during the on time of the high-side MOSFET. When the voltage at VBST falls below the voltage at VIN, the trickle charge control circuit decouples VCP from VBST. Since VCP from the charge pump is only coupled to a particular motor driver circuit when the voltage at VBST is greater than the voltage at VIN, during that circuit's high-side MOSFET on time, a single charge pump may be utilized to provide trickle charging for multiple motor driver circuits, reducing the required area.

Figure 2:
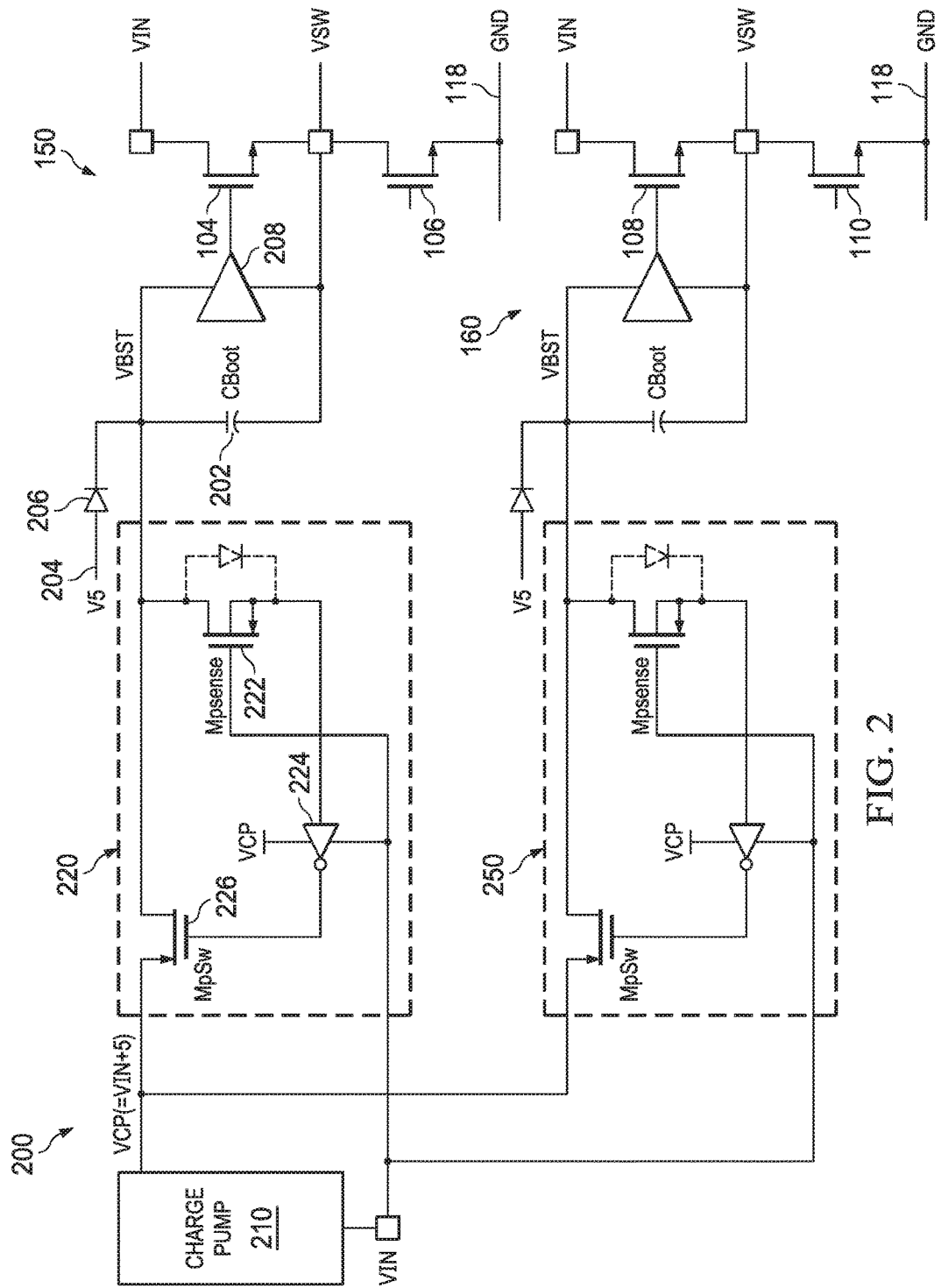
FIG. 2 shows a circuit schematic diagram of a system including a trickle charge control circuit in accordance with various examples.

FIG. 2 shows a system 200 in accordance with examples of the present disclosure. The system 200 includes a motor driver circuit 150 as described above with respect to FIG. 1b. The motor driver circuit 150 additionally includes a bootstrap capacitor 202, which is coupled to a DC voltage source 204 by way of a diode 206. The bootstrap capacitor 202 is coupled to and between VBST and VSW. The motor driver circuit 150 also includes a gate driver 208, which drives a gate of the high-side MOSFET 104 with VBST or VSW in response to receiving as an input an "on" signal or an "off" signal, respectively.

When the low-side MOSFET 106 is on, VSW is coupled to ground 118, or at 0V. The diode 206 is forward-biased because of the DC voltage source 204, which may be on the order of 5V, and thus the bootstrap capacitor 202 is charged to the voltage of the DC voltage source 204. When the low-side MOSFET 106 is turned off, a signal is provided to the gate driver 208 to turn on the high-side MOSFET 104. When the input to the gate driver 208 goes high, for example, VBST is coupled to the gate of the high-side MOSFET 104. Initially, VBST is at, for example, 5V, which is sufficient to turn the high-side MOSFET 104 on since VSW is initially at 0V. The bootstrap capacitor 202 is sufficiently sized so that as VSW is pulled up to VIN, VBST is also pulled up, ensuring that VBST is always greater than VSW by approximately 5V (i.e., the DC voltage source 204 voltage to which the bootstrap capacitor 202 is charged). Since the voltage at VBST is greater than the voltage at VSW during the high-side MOSFET's 104 on time, the gate of the high-side MOSFET 104 is adequately driven to maintain a tolerably low resistance between VIN and VSW. However, during lower-frequency operation of the motor driver circuit 150, the bootstrap capacitor 202 may discharge, resulting in the voltage at VBST falling back to the voltage at VSW, causing the high-side MOSFET 104 to turn off prematurely.

To address this shortcoming, the system 200 also includes a charge pump 210, which is coupled to VIN and generates a DC voltage at VCP, which is greater than the voltage at VIN. A trickle charge control circuit 220 is coupled to the charge pump 210 and the motor driver circuit 150. In the example shown in FIG. 2, the trickle charge control circuit 220 includes a p-type MOSFET 222 having its drain coupled to VBST, its gate coupled to VIN, and its source coupled to an input of an inverter 224. The inverter 224 has a high output of the voltage at VCP and a low output of the voltage at VIN; in other words, when the input to the inverter 224 is lower than the voltage at VCP by at least a threshold of the inverter 224, the output of the inverter 224 is the voltage at VCP, and when the input to the inverter 224 is within the threshold of the inverter 224 relative to the voltage at VCP, the output of the inverter 224 is the voltage at VIN. The trickle charge control circuit 220 also includes another p-type MOSFET 226 having its source coupled to VCP of the charge pump 210, its gate coupled to the output of the inverter 224, and its drain coupled to VBST.

Turning to FIG. 3, a signal diagram 300 illustrates the functionality of the system 200. Although not shown to scale, for the purposes of this example it is assumed that the voltage values are as shown, and as explained above. These voltage values are exemplary, and it should be appreciated that the scope of the present disclosure is not limited to only these voltage values. Initially, the low-side MOSFET 106 is on, and thus the high-side on (HS_ON) signal is low. At this point, VSW is tied to ground through the low-side MOSFET 106, and VBST is at 5V as the bootstrap capacitor 202 is charged by the voltage source 204 to 5V. When the HS_ON signal goes high at 302, the gate driver 208 applies the voltage at VBST to the gate of the high-side MOSFET 104, which pulls the voltage at VSW up to the voltage at VIN. Since the bootstrap capacitor 202 is charged to 5V, the voltage at VBST rises along with the voltage at VSW. At 304, the voltage at VBST rises above the voltage at VIN (the voltage at VIN is also applied to the gate of the p-type MOSFET 222), and thus the p-type MOSFET 222 turns on because its drain voltage is greater than its gate voltage. In this way, the p-type MOSFET 222 is referred to as "sensing" as it senses when the voltage at VBST rises above the voltage at VIN.

Since the input of the inverter 224 is coupled to the source of the sensing MOSFET 222, the voltage at the input to the inverter 224 (notated as INV_in in FIG. 3) rises with the voltage at VBST once the p-type MOSFET 222 turns on. As VBST and INV_in crosses above a threshold for the inverter 224, the voltage at the output of the inverter 224 (notated as INV_out in FIG. 3) goes low from the voltage at VCP to the voltage at VIN. Since the gate of the p-type MOSFET 226 is coupled to INV_out and the source of the p-type MOSFET 226 is coupled to VCP, when INV_out goes low to the voltage at VIN, the p-type MOSFET 226 turns on because its source voltage is greater than its gate voltage, and supplies the voltage at VCP to VBST. In this way, the p-type MOSFET 226 acts as a switch to couple VCP of the charge pump 210 to VBST of the motor driver circuit 150. When the p-type MOSFET 226 couples VCP to VBST, the bootstrap capacitor 202 is trickle charged to the voltage at VCP—since VSW is at the voltage at VIN, which is lower than the voltage at VCP—and avoids being discharged even during low-frequency operation where the on time for the high-side MOSFET 104 is longer.

When HS_ON again goes low at 306, the voltage at VSW is pulled back to ground through the low-side MOSFET 106. When the voltage at VBST drops below the threshold of the inverter 224, INV_out goes high to the voltage at VCP, which turns off the p-type MOSFET 226 since its gate and source are at the same voltage. At this point, the charge pump 210 is decoupled from VBST and the bootstrap capacitor 202 of the motor driver circuit 150 by virtue of the p-type MOSFET 226 being off. Further, as the voltage at VBST falls below the voltage at VIN, the p-type MOSFET 222 turns off because its drain voltage (at VBST) is lower than its gate voltage (at VIN), and thus no longer senses the voltage at VBST. The sensing MOSFET 222 only turns on when the voltage at VBST rises above the voltage at VIN, which prevents accidental coupling of VCP to VBST when the voltage at VBST is less than the voltage at VIN, which avoids exceeding the voltage rating of the bootstrap capacitor 202, which is commonly rated for approximately the difference between the voltage at VCP and the voltage at VIN, or 5V in the present example. Additionally, when the voltage at VBST is less than the voltage at VIN, not only is the sensing MOSFET 222 off, but the body diode of the sensing MOSFET 222 is reverse-biased, preventing the gate-to-source voltage of the sensing MOSFET 222 from exceeding a device rating, which is approximately 5V in the present example.

In the exemplary two-phase arrangement shown in FIG. 1a, for example, another trickle charge control circuit 250 is similarly coupled between the charge pump 210 and another motor driver circuit 160, including high- and low-side MOSFETS 108, 110, respectively. When the high-side MOSFET 104 of motor driver circuit 150 is turned off at 306, the high-side MOSFET 108 of the motor driver circuit 160 is turned on, and the trickle charge control circuit 250 functions similarly to the trickle charge control circuit 220. That is, the trickle charge control circuit 250 also senses the voltage at VBST of the motor driver circuit 160 and, as a result of the voltage at VBST of the motor driver circuit 160 being greater than the voltage at VIN, the trickle charge control circuit 250 couples VCP to VBST of the motor driver circuit 160. Similarly, as a result of the voltage at VBST of the motor driver circuit 160 being greater than the voltage at VIN, the trickle charge control circuit 250 decouples VCP from VBST of the motor driver circuit 160. For multi-phase motors, additional trickle charge control circuits may be implemented for the additional motor driver circuits, while sharing the same charge pump 210. As a result, only one charge pump 210 is required for multiple motor driver circuits to sufficiently drive the gates of their high-side MOSFETs, which reduces the overall space requirements of the system 200.

Figure 4:
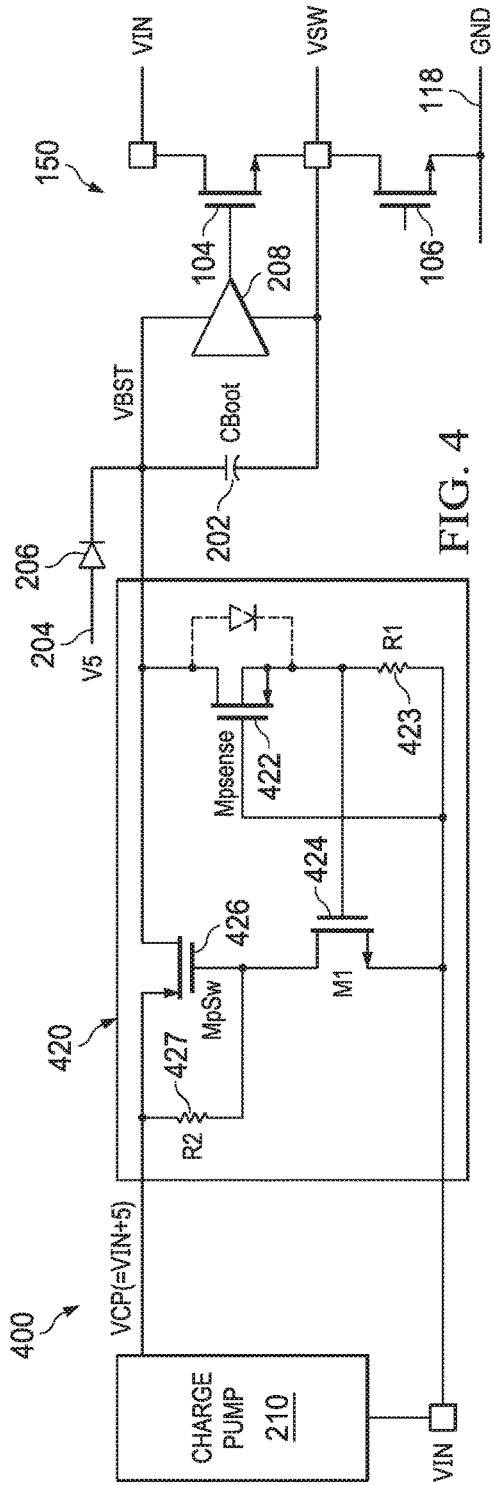
FIG. 4 shows a circuit schematic diagram of a system including another trickle charge control circuit in accordance with various examples.

FIG. 4 shows a system 400 including another example of a trickle charge control circuit 420. The system 400 includes a charge pump 210 and a motor driver circuit 150, which function as described above with respect to the system 200 of FIG. 2. The trickle charge control circuit 420 is coupled to the charge pump 210 and the motor driver circuit 150. In the example shown in FIG. 4, the trickle charge control circuit 420 includes a p-type sensing MOSFET 422 having its drain coupled to VBST, its gate coupled to VIN, and its source coupled to VIN via a resistor 423 and to a gate of an n-type MOSFET 424. The n-type MOSFET 424 source is coupled to VIN. The trickle charge control circuit 420 also includes another p-type MOSFET 426 having its source coupled to VCP, its drain coupled to VBST, and its gate coupled to the drain of the n-type MOSFET 424. A resistor 427 couples the gate and source of the p-type MOSFET 426.

As explained, the function of both the charge pump 210 and the motor driver circuit 150 (and its control signals, such as HS_ON) are similar to those described above with respect to FIGS. 2 and 3. Thus, initially, the low-side MOSFET 106 is on, and VSW is tied to ground through the low-side MOSFET 106 and VBST is at 5V as the bootstrap capacitor 202 is charged by the voltage source to 5V. When the HS_ON signal goes high, the gate driver 208 applies the voltage at VBST to the gate of the high-side MOSFET 104, which pulls the voltage at VSW up to the voltage at VIN. Since the bootstrap capacitor 202 is charged to 5V, the voltage at VBST rises along with the voltage at VSW. When the voltage at VBST rises above the voltage at VIN, which is also applied to the gate of the p-type MOSFET 422, the p-type MOSFET 422 turns on because its drain voltage is greater than its gate voltage.

When the p-type MOSFET 422 turns on, its source voltage is pulled up to the voltage at VBST and there is a voltage drop across the resistor 423. Since the source of the n-type MOSFET 424 is at the lower voltage of VIN, when the p-type MOSFET 422 turns on and the voltage at VBST is provided to the gate of the n-type MOSFET 424, the n-type MOSFET 424 also turns on, providing the voltage at VIN to the gate of the p-type MOSFET 426. Since the source of the p-type MOSFET 426 is at the higher voltage at VCP, when the n-type MOSFET 424 turns on and the voltage at VIN is provided to the gate of the p-type MOSFET 426, the p-type MOSFET 426 also turns on, coupling VCP to VBST. In this way, the p-type MOSFET 426 acts as a switch to couple VCP of the charge pump 210 to VBST of the motor driver circuit 150. When the p-type MOSFET 426 couples VCP to VBST, the bootstrap capacitor 202 is trickle charged to the voltage at VCP—since VSW is at the voltage at VIN, which is lower than the voltage at VCP—and avoids being discharged even during low-frequency operation where the on time for the high-side MOSFET 104 is longer.

When HS_ON again goes low, the voltage at VBST falls below the voltage at VIN and the p-type MOSFET 422 turns off. As a result, the resistor 423 pulls the voltage at the gate of the n-type MOSFET 424 down to the voltage at VIN, and the n-type MOSFET 424 turns off. Similarly, the resistor 427 pulls the voltage at the gate of the p-type MOSFET 426 up to the voltage at VCP, and the p-type MOSFET 426 turns off. At this point, the charge pump 210 is decoupled from VBST and the bootstrap capacitor 202 of the motor driver circuit 150 by virtue of the p-type MOSFET 426 being off. Further, as the voltage at VBST falls below the voltage at VIN, the p-type MOSFET 422 turns off because its drain voltage (at VBST) is lower than its gate voltage (at VIN), and thus no longer senses the voltage at VBST. The sensing MOSFET 422 only turns on when the voltage at VBST rises above the voltage at VIN, which prevents accidental coupling of VCP to VBST when the voltage at VBST is less than the voltage at VIN, which avoids exceeding the voltage rating of the bootstrap capacitor 202, which is commonly rated for approximately the difference between the voltage at VCP and the voltage at VIN, or 5V in the present example.

Additionally, when the voltage at VBST is less than the voltage at VIN, not only is the sensing MOSFET 422 off, but the body diode of the sensing MOSFET 422 is reverse-biased, preventing the gate-to-source voltage of the sensing MOSFET 422 from exceeding a device rating, which is approximately 5V in the present example.

Figure 5:
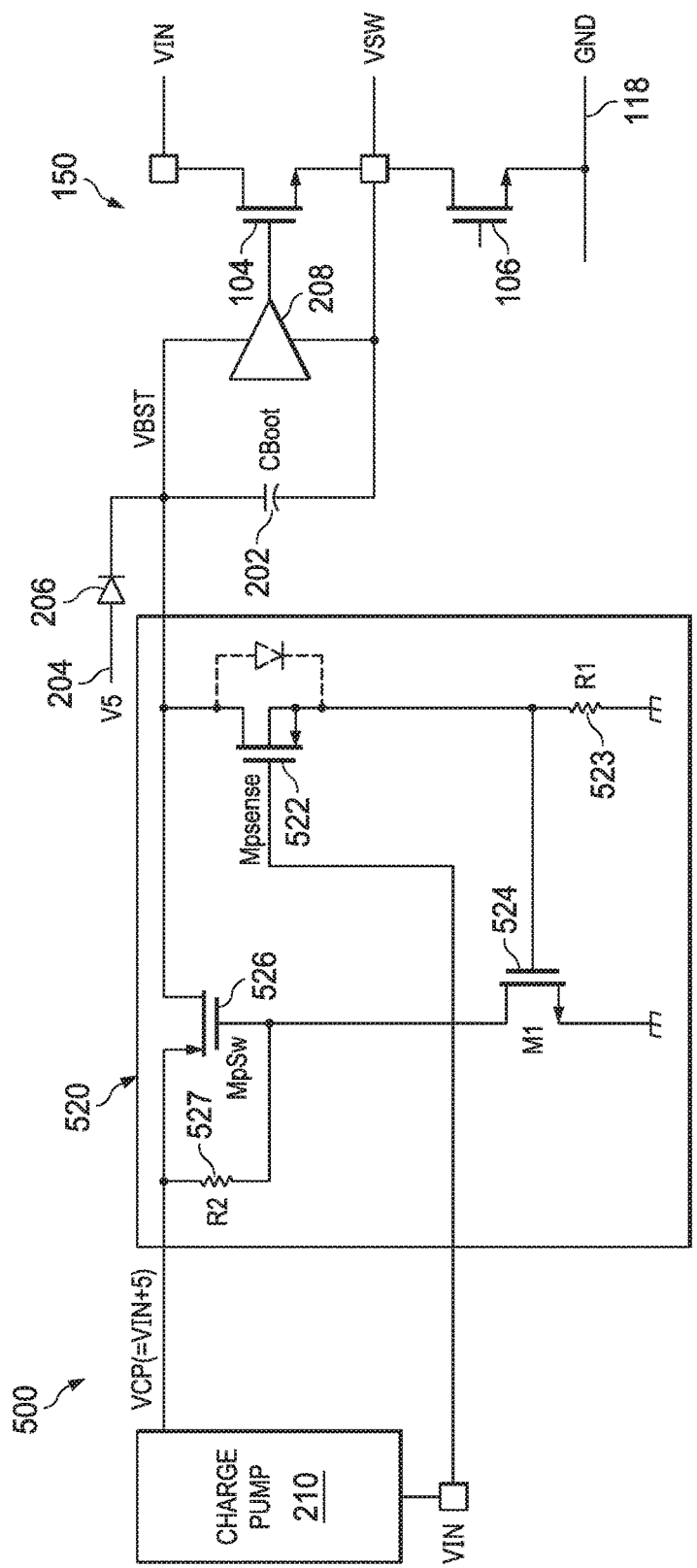
FIG. 5 shows a circuit schematic diagram of a system including yet another trickle charge control circuit in accordance with various examples.

FIG. 5 shows a system 500 including another example of a trickle charge control circuit 520. The system 500 includes a charge pump 210 and a motor driver circuit 150, which function as described above with respect to the system 200 of FIG. 2. The trickle charge control circuit 520 is coupled to the charge pump 210 and the motor driver circuit 150. In the example shown in FIG. 5, the trickle charge control circuit 520 includes a p-type sensing MOSFET 522 having its drain coupled to VBST, its gate coupled to VIN, and its source coupled to ground via a resistor 523 and to a gate of an n-type MOSFET 524. The n-type MOSFET 524 source is coupled to ground. The trickle charge control circuit 520 also includes another p-type MOSFET 526 having its source coupled to VCP, its drain coupled to VBST, and its gate coupled to the drain of the n-type MOSFET 524. A resistor 527 couples the gate and source of the p-type MOSFET 526.

As explained, the function of both the charge pump 210 and the motor driver circuit 150 (and its control signals, such as HS_ON) are similar to those described above with respect to FIGS. 2-4. Thus, initially, the low-side MOSFET 106 is on, and VSW is tied to ground through the low-side MOSFET 106 and VBST is at 5V as the bootstrap capacitor 202 is charged by the voltage source to 5V. When the HS_ON signal goes high, the gate driver 208 applies the voltage at VBST to the gate of the high-side MOSFET 104, which pulls the voltage at VSW up to the voltage at VIN. Since the bootstrap capacitor 202 is charged to 5V, the voltage at VBST rises along with the voltage at VSW. When the voltage at VBST rises above the voltage at VIN, which is also applied to the gate of the p-type MOSFET 522, the p-type MOSFET 522 turns on because its drain voltage is greater than its gate voltage.

When the p-type MOSFET 522 turns on, its source voltage is pulled up to the voltage at VBST and there is a voltage drop across the resistor 523. Since the source of the n-type MOSFET 524 is at ground, when the p-type MOSFET 522 turns on and the voltage at VBST is provided to the gate of the n-type MOSFET 524, the n-type MOSFET 424 also turns on, providing the voltage at ground to the gate of the p-type MOSFET 526. Since the source of the p-type MOSFET 526 is at the higher voltage at VCP, when the n-type MOSFET 524 turns on and the voltage at ground is provided to the gate of the p-type MOSFET 526, the p-type MOSFET 526 also turns on, coupling VCP to VBST. In this way, the p-type MOSFET 526 acts as a switch to couple VCP of the charge pump 210 to VBST of the motor driver circuit 150. When the p-type MOSFET 526 couples VCP to VBST, the bootstrap capacitor 202 is trickle charged to the voltage at VCP—since VSW is at the voltage at VIN, which is lower than the voltage at VCP—and avoids being discharged even during low-frequency operation where the on time for the high-side MOSFET 104 is longer.

When HS_ON again goes low, the voltage at VBST falls below the voltage at VIN and the p-type MOSFET 522 turns off. As a result, the resistor 523 pulls the voltage at the gate of the n-type MOSFET 524 down to ground, and the n-type MOSFET 524 turns off. Similarly, the resistor 527 pulls the voltage at the gate of the p-type MOSFET 526 up to the voltage at VCP, and the p-type MOSFET 526 turns off. At this point, the charge pump 210 is decoupled from VBST and the bootstrap capacitor 202 of the motor driver circuit 150 by virtue of the p-type MOSFET 526 being off. Further, as the voltage at VBST falls below the voltage at VIN, the p-type MOSFET 522 turns off because its drain voltage (at VBST) is lower than its gate voltage (at VIN), and thus no longer senses the voltage at VBST. The sensing MOSFET 522 only turns on when the voltage at VBST rises above the voltage at VIN, which prevents accidental coupling of VCP to VBST when the voltage at VBST is less than the voltage at VIN, which avoids exceeding the voltage rating of the bootstrap capacitor 202, which is commonly rated for approximately the difference between the voltage at VCP and the voltage at VIN, or 5V in the present example. Additionally, when the voltage at VBST is less than the voltage at VIN, not only is the sensing MOSFET 522 off, but the body diode of the sensing MOSFET 522 is reverse-biased, preventing the gate-to-source voltage of the sensing MOSFET 522 from exceeding a device rating, which is approximately 5V in the present example.

FIG. 6 shows a system 600 including yet another example of a trickle charge control circuit 620. The system 600 includes a charge pump 210 and a motor driver circuit 150, which function as described above with respect to the system 200 of FIG. 2. The trickle charge control circuit 620 is coupled to the charge pump 210 and the motor driver circuit 150. In the example shown in FIG. 6, the trickle charge control circuit 620 includes a diode 622 having its anode coupled to VBST and its cathode coupled to VIN via a resistor 623 and to an input of an inverter 624. The diode 622 conducts the voltage at VBST to the input of the inverter 624 only when the voltage at VBST is greater than the voltage at VIN by a diode voltage drop (e.g., 0.6V) and cuts off when the voltage at VBST is less than the diode voltage drop above the voltage at VIN. During cut-off of the diode 622, the resistor 623 pulls the input to the inverter 624 to the voltage at VIN. The inverter 624 has a high output of the voltage at VCP and a low output of the voltage at VIN; in other words, when the input to the inverter 624 is lower than the voltage at VCP by at least a threshold of the inverter 624, the output of the inverter 624 is the voltage at VCP, and when the input to the inverter 624 is within the threshold of the inverter 624 relative to the voltage at VCP, the output of the inverter 624 is the voltage at VIN. The trickle charge control circuit 620 also includes another p-type MOSFET 626 having its source coupled to VCP of the charge pump 210, its gate coupled to the output of the inverter 624, and its drain coupled to VBST.

As above, when the HS_ON signal goes high, the gate driver 208 applies the voltage at VBST to the gate of the high-side MOSFET 104, which pulls the voltage at VSW up to the voltage at VIN. Since the bootstrap capacitor 202 is charged to 5V, the voltage at VBST rises along with the voltage at VSW. When the voltage at VBST rises above the voltage at VIN, the diode 622 becomes forward-biased and the voltage at VBST, less a diode voltage drop, is applied to the input of the inverter 624. When the voltage at VBST is greater than the voltage at VIN by a threshold of the inverter 624 plus the diode voltage drop, the output of the inverter 624 is the voltage at VIN. The inverter 624 and the p-type MOSFET 626 function similarly to the inverter 224 and the p-type MOSFET 226 described above with respect to FIG. 2, except that the threshold of the inverter 624 may be adjusted to take into account the fact that the input to the inverter 624 will not reach the voltage at VBST due to the voltage drop across the diode 622. Thus, when the input to the inverter 624 is greater than the voltage at VIN by the threshold of the inverter (i.e., the voltage at VBST minus the diode 622 voltage drop is greater than the voltage at VIN by the threshold of the inverter), this corresponds to a "high" input.

FIG. 7 shows a system 700 including still another example of a trickle charge control circuit 720. The system 700 includes a charge pump 210 and a motor driver circuit 150, which function as described above with respect to the system 200 of FIG. 2. The trickle charge control circuit 720 is coupled to the charge pump 210 and the motor driver circuit 150. In the example shown in FIG. 7, the trickle charge control circuit 720 includes a diode 722 having its anode coupled to VBST and its cathode coupled to VIN via a resistor 723 and to a gate of an n-type MOSFET 724. The n-type MOSFET 724 source is coupled to VIN. The trickle charge control circuit 720 also includes a p-type MOSFET 726 having its source coupled to VCP, its drain coupled to VBST, and its gate coupled to the drain of the n-type MOSFET 724. A resistor 727 couples the gate and source of the p-type MOSFET 726.

As above, when the HS_ON signal goes high, the gate driver 208 applies the voltage at VBST to the gate of the high-side MOSFET 104, which pulls the voltage at VSW up to the voltage at VIN. Since the bootstrap capacitor 202 is charged to 5V, the voltage at VBST rises along with the voltage at VSW. When the voltage at VBST rises above the voltage at VIN, the diode 722 becomes forward-biased and the voltage at VBST, less a diode voltage drop, is provided to the gate of the n-type MOSFET 724. The voltage drop across the diode 722 is relatively small, and thus even the voltage at VBST less the diode voltage drop is greater than the voltage at VIN, and the n-type MOSFET 724, the p-type MOSFET 726, and the resistor 727 operate the same as the n-type MOSFET 424, the p-type MOSFET 426, and the resistor 427 described above with respect to FIG. 4.

As explained above, the foregoing examples and following claims relate to a trickle charge control circuit that couples and decouples a charge pump to and from a motor driver circuit. By sensing the voltage at VBST of the motor driver circuit, the trickle charge control circuit ensures that the charge pump is only coupled to a particular motor driver circuit when the voltage at VBST is greater than the voltage at VIN, which is during that circuit's high-side MOSFET on time. As a result, a single charge pump may be utilized to provide trickle charging for multiple motor driver circuits, reducing the required circuit area and permitting low-frequency operation that would normally result in a premature discharge of the bootstrap capacitors of the motor driver circuits.

In the foregoing discussion and in the claims, reference is made to a charge pump, one or more trickle charge control circuits, and one or more motor driver circuits. It should be appreciated that these blocks and circuits, as the case may be, correspond to hardware circuitry, for example implemented on one or more integrated circuits (ICs). Indeed, in at least one example, the charge pump, one or more trickle charge control circuits, and one or more motor driver circuits are implemented on an IC.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
a trickle charge control circuit coupled to a charge pump and a motor driver circuit, configured to:
  sense a voltage at a bootstrap capacitor voltage (VBST) node of the motor driver circuit;
  as a result of the voltage at the VBST node being greater than a voltage at an input voltage (VIN) node, directly couples a charge pump voltage (VCP) node to the VBST node of the motor driver circuit by turning on a first p-type MOSFET, wherein a voltage at the VCP node is greater than the voltage at the VIN node; and
  as a result of the voltage at the VBST node being less than the voltage at the VIN node, directly decouples the VCP node from the VBST node by turning off the first p-type MOSFET.

2. The system of claim 1 wherein the trickle charge control circuit further comprises:
an inverter having an input, an output, a first voltage supply node, and a second voltage supply node wherein the VCP node is directly coupled to the first voltage supply node and the VIN node is directly coupled to the second voltage supply node;
a second p-type MOSFET comprising a drain coupled to the VBST node, a source coupled to the input of the inverter, and a gate coupled to the VIN node; and
wherein the first p-type MOSFET comprises a source coupled to the VCP node, a drain coupled to the VBST node, and a gate coupled to an output of the inverter.

3. The system of claim 1 wherein the trickle charge control circuit further comprises:
an n-type MOSFET comprising a source coupled to ground, a drain, and a gate;
a second p-type MOSFET comprising a drain coupled to the VBST node, a source coupled to ground via a first resistor and to the gate of the first n-type MOSFET, and a gate coupled to VIN; and
a second resistor coupled to the VCP node and the gate of the second p-type MOSFET;

wherein the first p-type MOSFET comprises a source coupled to the VCP node, a drain coupled to the VBST node, and a gate coupled to the drain of the first n-type MOSFET.

4. The system of claim 1 wherein the trickle charge control circuit further comprises:
   an inverter having an input, an output, a first voltage supply node, and a second voltage supply node wherein the VCP node is directly coupled to the first voltage supply node and the VIN node is directly coupled to the second voltage supply node; and
   a diode comprising an anode coupled to the VBST node and a cathode coupled to the VIN node via a resistor and to an input of the inverter;
   wherein the first p-type MOSFET comprises a source coupled to the VCP node, a drain coupled to the VBST node, and a gate coupled to an output of the inverter.

5. The system of claim 1 wherein the trickle charge control circuit further comprises:
   an n-type MOSFET comprising a source coupled to VIN, a drain, and a gate;
   a diode comprising an anode coupled to VBST and a cathode coupled to the VIN node via a first resistor and to the gate of the n-type MOSFET; and
   a second resistor coupled to the VCP node and the gate of the second p-type MOSFET;
   wherein the first p-type MOSFET comprises a source coupled to the VCP node, a drain coupled to the VBST node, and a gate coupled to the drain of the first n-type MOSFET.

* * * * *